US011221974B2

(12) United States Patent
Li et al.

(10) Patent No.: US 11,221,974 B2
(45) Date of Patent: Jan. 11, 2022

(54) DEVICE AND METHOD FOR LOW LATENCY MEMORY ACCESS

(71) Applicant: ALIBABA GROUP HOLDING LIMITED, Grand Cayman (KY)

(72) Inventors: Shuangchen Li, San Mateo, CA (US); Dimin Niu, San Mateo, CA (US); Hongzhong Zheng, San Mateo, CA (US)

(73) Assignee: ALIBABA GROUP HOLDING LIMITED, Grand Cayman (KY)

( * ) Notice: Subject to any disclaimer, the term of this patent is extended or adjusted under 35 U.S.C. 154(b) by 0 days.

(21) Appl. No.: 16/789,382

(22) Filed: Feb. 12, 2020

(65) Prior Publication Data

US 2021/0248093 A1 Aug. 12, 2021

(51) Int. Cl.
*G06F 13/16* (2006.01)
*G11C 11/4093* (2006.01)
*G11C 11/4096* (2006.01)
*G11C 11/408* (2006.01)

(52) U.S. Cl.
CPC ...... *G06F 13/1668* (2013.01); *G11C 11/4093* (2013.01); *G11C 11/4096* (2013.01); *G11C 11/4087* (2013.01)

(58) Field of Classification Search
CPC .............. G06F 13/1668; G11C 11/4096; G11C 11/4093; G11C 11/4087
See application file for complete search history.

(56) References Cited

U.S. PATENT DOCUMENTS 5,126,808 A * 6/1992 Montalvo ........... H01L 29/7885
257/316
5,737,258 A * 4/1998 Choi ...................... G11C 5/025
365/63

(Continued)

OTHER PUBLICATIONS

International search report and written opinion in related International Application No. PCT/US2021/014599, dated Feb. 25, 2021 (10 pgs.).

*Primary Examiner* — Ajay Ojha
(74) *Attorney, Agent, or Firm* — Finnegan, Henderson, Farabow, Garrett & Dunner, LLP

(57) ABSTRACT

Embodiments of the disclosure provide memory devices and methods related to memory accessing. The memory device can include: a plurality of memory blocks, each comprising a plurality of memory cells; a word line communicatively coupled with the plurality of memory blocks and configured to activate memory cells associated with the word line in the plurality of memory blocks; a column selection line communicatively coupled with the plurality of memory blocks and configured to select a column of memory blocks among the plurality of memory blocks; a global data line communicatively coupled with the plurality of memory blocks and configured to transceive data with the selected column of memory blocks; a first switch disposed on a first position on the column selection line; and a second switch disposed on a second position on the global data line, wherein the first switch and the second switch are configured to segment at least one memory block of the plurality of memory blocks from other memory blocks of the plurality of memory blocks.

21 Claims, 6 Drawing Sheets

(56) References Cited

U.S. PATENT DOCUMENTS

| | | | | |
|---|---|---|---|---|
| 7,440,350 | B2* | 10/2008 | Obara | G11C 7/12 |
| | | | | 257/E27.081 |
| 7,663,955 | B2* | 2/2010 | Miller | G11C 11/4091 |
| | | | | 365/207 |
| 10,332,587 | B1* | 6/2019 | Sung | G11C 11/4091 |
| 2011/0026348 | A1* | 2/2011 | Narui | G11C 11/4097 |
| | | | | 365/210.1 |
| 2012/0250437 | A1* | 10/2012 | Nagata | G11C 29/84 |
| | | | | 365/200 |
| 2019/0042160 | A1* | 2/2019 | Kumar | G11C 11/419 |
| 2019/0341103 | A1* | 11/2019 | Campardo | G11C 13/0004 |

\* cited by examiner

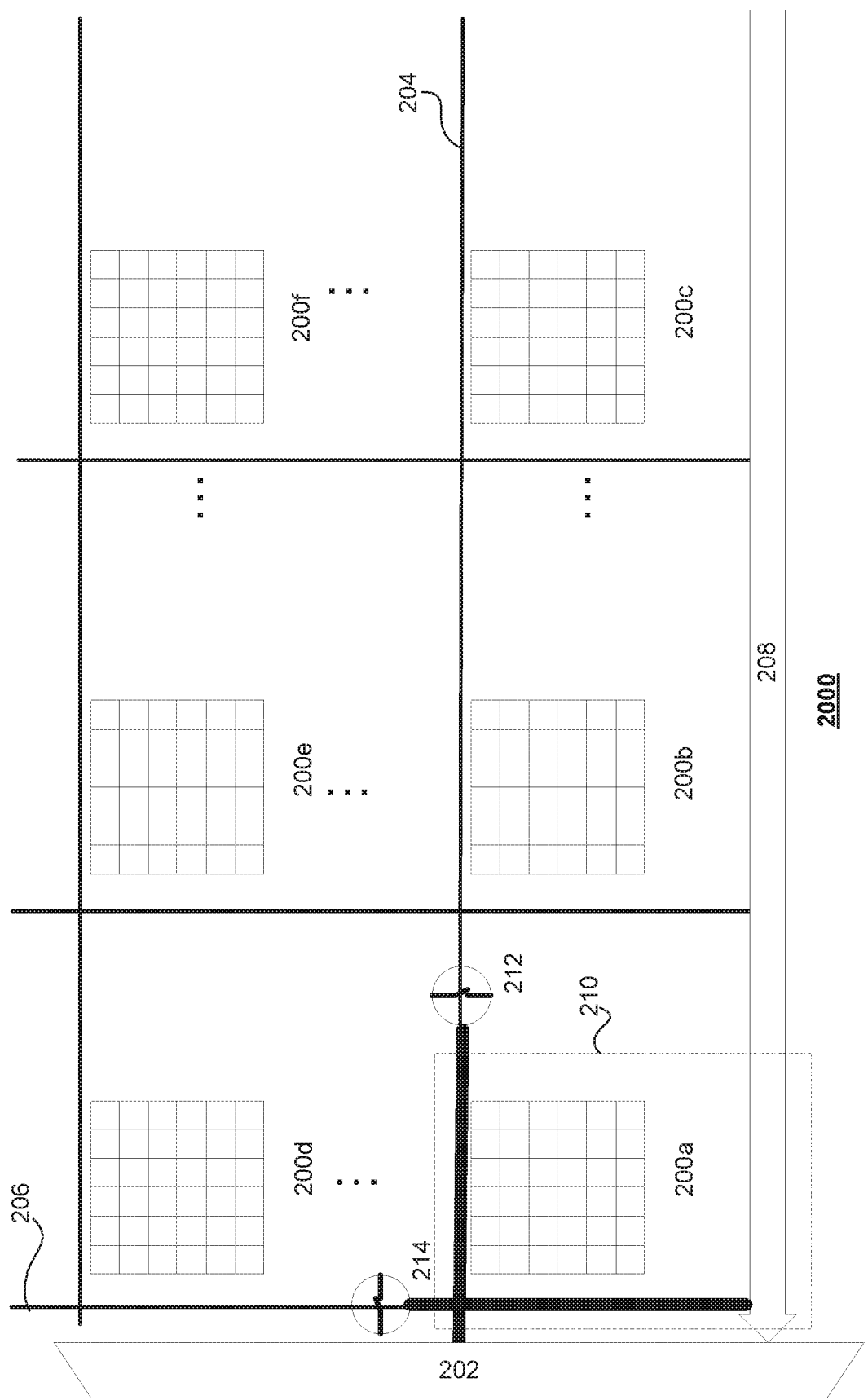

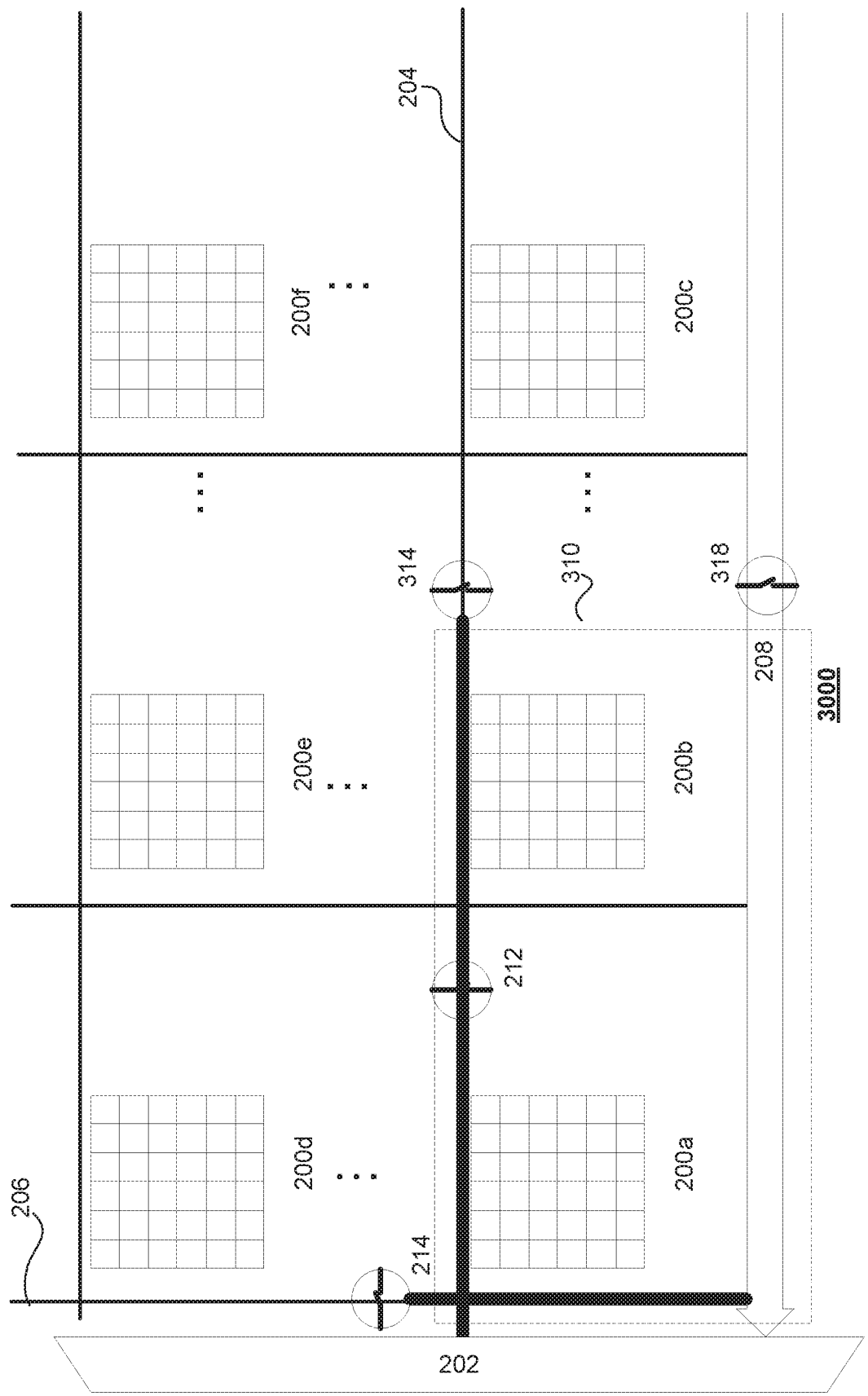

DEVICE AND METHOD FOR LOW LATENCY MEMORY ACCESS

BACKGROUND

Random access memory (RAM) consists of a plurality of memory blocks. The plurality of memory blocks can be accessed by signal lines (e.g., bit lines, word lines, data lines, and the like). The signal lines can transceive signal/data with the plurality of memory blocks by potentials on the signal lines.

To reduce the cost-per-bit of RAM, the signal lines can be extended to link more memory blocks. However, a signal line has an associated parasitic capacitance and has a value that is proportional to a length of the signal line. Therefore, while the signal line is being extended to lower the cost-per-bit, the associated parasitic capacitance can also be increased. With the increased associated parasitic capacitance, it takes more time to change a potential on the signal line to a target potential. As a result, RAM latency is increased.

SUMMARY

Embodiments of the disclosure provide a memory device. The memory device can include: a plurality of memory blocks, each comprising a plurality of memory cells; a word line communicatively coupled with the plurality of memory blocks and configured to activate memory cells associated with the word line in the plurality of memory blocks; a column selection line communicatively coupled with the plurality of memory blocks and configured to select a column of memory blocks among the plurality of memory blocks; a global data line communicatively coupled with the plurality of memory blocks and configured to transceive data with the selected column of memory blocks; a first switch disposed on a first position on the column selection line; and a second switch disposed on a second position on the global data line, wherein the first switch and the second switch are configured to segment at least one memory block of the plurality of memory blocks from other memory blocks of the plurality of memory blocks.

Embodiments of the disclosure further provide a method for accessing a memory device, wherein the memory device comprises a column selection line having a first switch disposed thereon and a global data line having a second switch disposed thereon. The method can include: receiving an access request for accessing the memory device having a plurality of memory blocks; determining whether the access request is directed to a region having at least one memory block of the plurality of memory blocks; in response to the access request being directed to the region, generating a first-type access signal based on the access request to cause the first and second switches to be turned off to segment the at least one memory block from other memory blocks of the plurality of memory blocks; and accessing the segmented at least one memory block based on the first-type access signal.

Embodiments of the disclosure also provide a non-transitory computer readable medium that stores a set of instructions that is executable by one or more processors of a computer system to cause the computer system to perform a method for accessing a memory device of the computer system. The memory device can include a column selection line having a first switch disposed thereon and a global data line having a second switch disposed thereon. The method can include: receiving an access request for accessing the memory device having a plurality of memory blocks; determining whether the access request is directed to a region having at least one memory block of the plurality of memory blocks; in response to the access request being directed to the region, generating a first-type access signal based on the access request to cause the first and second switches to be turned off to segment the at least one memory block from other memory blocks of the plurality of memory blocks; and accessing the segmented at least one memory block based on the first-type access signal.

It is to be understood that both the foregoing general description and the following detailed description are exemplary and explanatory only and are not restrictive of the disclosed embodiments, as claimed.

BRIEF DESCRIPTION OF THE DRAWINGS

Embodiments and various aspects of the present disclosure are illustrated in the following detailed description and the accompanying figures. Various features shown in the figures are not drawn to scale.

FIG. 2 illustrates a schematic diagram of an exemplary memory device, according to some embodiments of the disclosure.

FIG. 3 illustrates a schematic diagram of another exemplary memory device, according to some embodiments of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations. Instead, they are merely examples of apparatuses and methods consistent with aspects related to the disclosed embodiments as recited in the appended claims.

As used herein, the terms "comprises," "comprising," or any other variation thereof are intended to cover a non-exclusive inclusion, such that a process, method, composition, article, or apparatus that comprises a list of elements does not include only those elements but may include other elements not expressly listed or inherent to such process, method, composition, article, or apparatus. The term "exemplary" is used in the sense of "example" rather than "ideal."

To address the increased latency of RAM, embodiments of the disclosure provide a memory device. In some embodiments, the memory device can provide a first switch on a first position on a column selection line and a second switch on a second position on a global data line. The first switch and the second switch are configured to segment at least one memory block of the plurality of memory blocks from other memory blocks of the plurality of memory blocks in response to a fast access signal. Therefore, the column selection line and the global data line, as signal lines, can be shortened on condition to decrease the access latency of the memory device. In another embodiment, the memory device can further provide a third switch on a data bus. The third switch is configured to cut off the data bus in response to the fast access signal. Therefore, the data bus can also be shorten on condition to further decrease the access latency of the memory device.

Embodiments of the disclosure can be applied to a variety of memories, such as a dynamic random access memory (DRAM), a phase change memory (PCM), a resistive random-access memory (ReRAM), and the like. The DRAM will be taken merely as an example to illustrate embodiments of the disclosure.

Figure 1A:
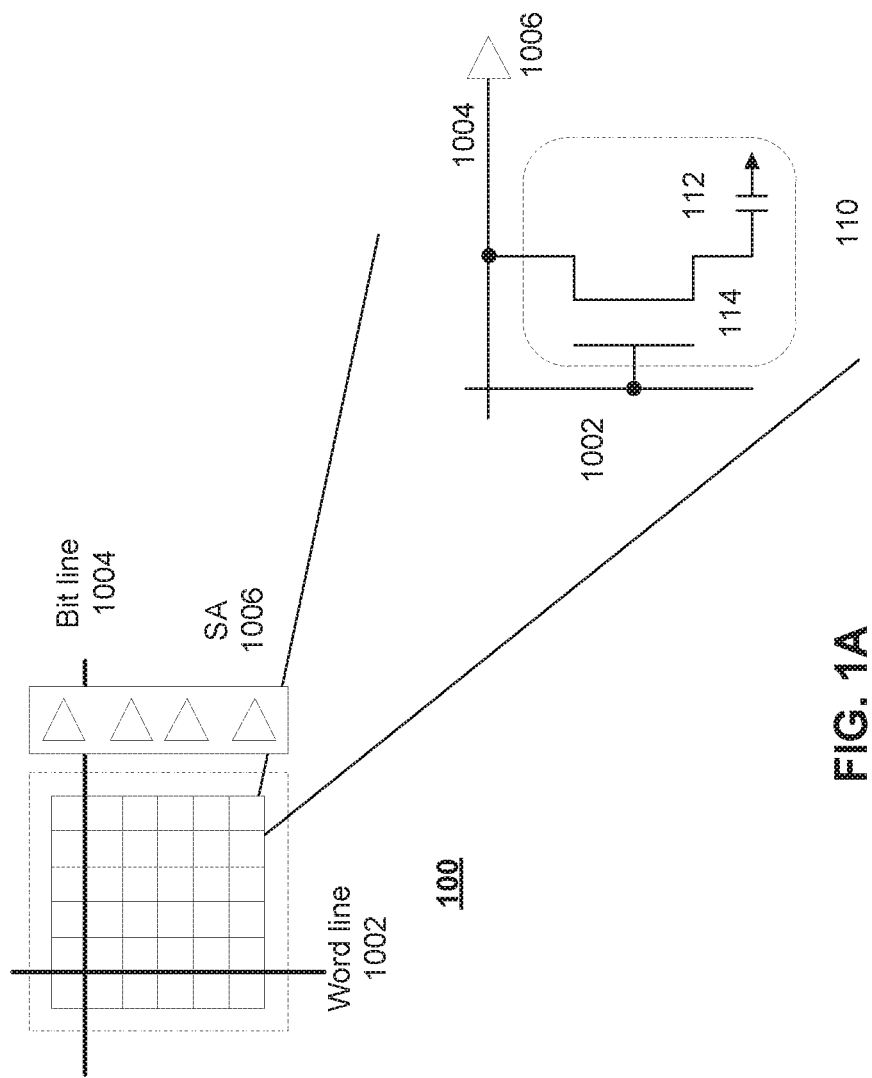
FIG. 1A illustrates a schematic diagram of an exemplary memory block, according to some embodiments of the disclosure.

FIG. 1A illustrates a schematic diagram of an exemplary memory block 100, according to some embodiments of the disclosure.

Memory block 100 can include a plurality of memory cells 110 electrically connected to a plurality of word lines 1002 and a plurality of bit lines 1004. Generally, each column of memory cells can be connected to a same word line, and each row of memory cells can be connected to a same data line. It is appreciated that the word line can be a row line and the data line can be a column line. FIG. 1A only illustrates an exemplary word line and an exemplary data line for clarity. Memory cell 110 can include a capacitor 112 and a transistor 114. A bit of data can be represented by electrical charges stored in capacitor 112.

A column of memory cells 110 can be selected by a word line 1002, which can cause the connection between a bit line 1004 and capacitor 112. For example, with a high potential applied on transistor 114 by word line 1002, transistor 114 can connect capacitor 112 to bit line 1004. Thus, the electrical charges stored in capacitor 112 can cause a potential change on bit line 1004. Thus, by raising word line 1002, a row of memory cells can be connected to bit lines corresponding to the row of memory cells.

Sense amplifiers 1006 can be connected to bit lines 1004 to sense or cause potential changes on bit lines 1004. For example, in reading a memory cell, sense amplifier 1006 can be used to sense a potential change on bit line 1004 caused by capacitor 112, and the sensed potential change can be processed to generate "0" or "1." In other words, when the wordline is selected, the data in the corresponding cell is fed into a sense amplifier through the corresponding bitline. Similarly, in writing a memory cell, a potential change on bit line 1004 can be used to charge or deplete the storage capacitor. For example, bit line 1004 can be charged or depleted by sense amplifier 1006 to further charge or deplete capacitor 112 of memory cell 110.

The selection of a column of memory cells by a word line and the potential changes sensed or caused by a sense amplifier can also be referred to as an activation phase.

Sense amplifiers 1006 can also be connected to data lines to further sense or drive the data lines through potential changes on the data lines. A column of memory banks (as well as memory cells in the memory banks) can be selected by a column selection line (CSL), causing sense amplifiers of the selected column of memory banks including the selected memory cells to sense or drive data lines 106, which eventually transceive data with an I/O interface of a dynamic random access memory (DRAM) via a data bus. This process can also be referred to as an I/O phase. Description of the DRAM, the data bus, and the data line will be further provided below.

After the I/O phase, the raised word line 1002 can be lowered, disconnecting the column of memory cells from the bit lines 1004. Meanwhile, the sense amplifiers (e.g., sense amplifiers 1006) and the bit lines (e.g., bit lines 1004) corresponding to the column of memory cells can be initialized. This process can be also be referred to as a precharging phase.

Figure 1B:
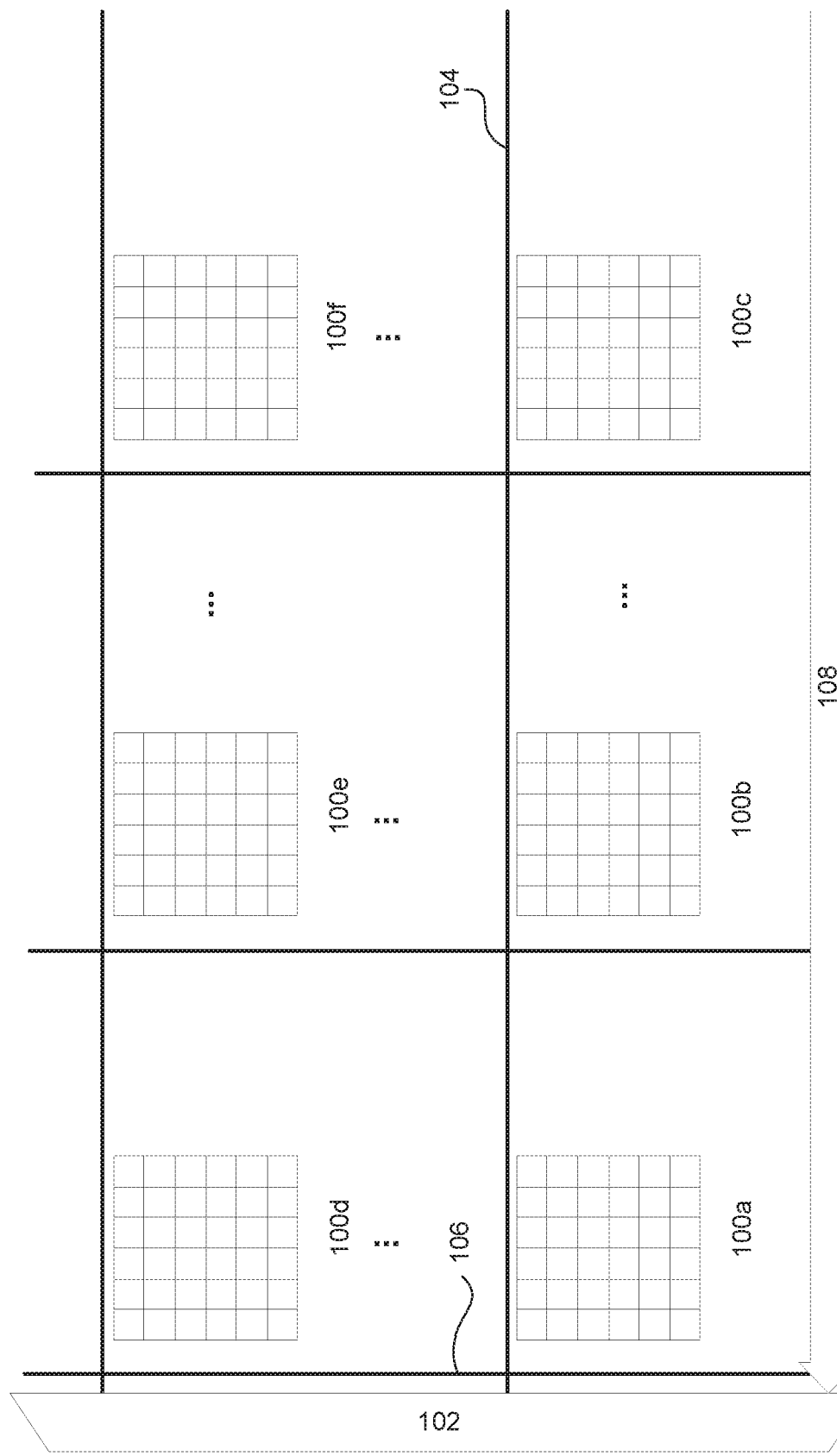
FIG. 1B illustrates a schematic diagram of a dynamic random access memory (DRAM), according to some embodiments of the disclosure.

FIG. 1B illustrates a schematic diagram of an exemplary dynamic random access memory (DRAM) 1000, according to some embodiments of the disclosure. DRAM 1000 can be used by any computing system, such as a personal computer, a cloud server, a mobile device, a processor-in-memory (PIM) device, and the like.

As shown in FIG. 1B, DRAM 1000 can include a plurality of memory blocks 100 of FIG. 1A (e.g., 100a, 100b, 100c, 100d, 100e, 100f, and the like), a controller 102, a plurality of column selection lines 104, a plurality of data lines 106, and a data bus 108. A memory block can be part of a memory bank, and include a plurality of memory cells and sense amplifiers as described with reference to FIG. 1A.

Controller 102 can be communicatively coupled with column selection line 104, data line 106, and data bus 108. In some embodiments, controller 102 can generate an access signal based on an access request for accessing DRAM 1000.

A column selection line 104 can be communicatively coupled with controller 102 and the plurality of memory blocks 100 and used to select a column of memory blocks 100 for transceiving data. The selection of the column of memory blocks 100 can be based on an address of memory to be accessed. For example, based on an access request, controller 102 can determine a memory block to be accessed and send an access signal to select column selection line 104 corresponding to the access request. It is appreciated that each memory block can further decode the access signal to determine an address for the memory cell(s) corresponding to the access request. Therefore, the corresponding memory cells can be selected by column selection line 104 and data of the corresponding memory cells can be passed to a data line.

A data line 106 can be communicatively coupled with data bus 108 and the plurality of memory blocks 100 and used to further transceive data with the selected column of memory blocks. Data line 106 can also be referred to as a global data line. As discussed with reference to FIG. 1A, data lines can transceive data with memory cells, and thus, data corresponding to the memory cells can be transceived with data bus 108 using the data lines.

Data bus 108 can include other logic, such as pads, interfaces, and the like. Data bus 108 can be connected to data line 106 to transceive data therewith. For example, in reading DRAM 1000, data lines 106 can send data to data bus 108, which further transmit the data to an input/output (I/O) interface (not shown) of DRAM 1000. In writing DRAM 1000, data bus 108 can transmit data received from the I/O interface to data lines 106, which can further alter the status of capacitors of memory cells with the potential on data lines 106.

To reduce DRAM cost-per-bit, wires (e.g., column selection line 104, data line 106, and data bus 108) can be extended to link more memory blocks. However, a wire has an associated parasitic capacitance that is proportional to a length of the wire. Therefore, while the wire is being extended to lower the cost-per-bit, the associated parasitic capacitance can be increased proportionally. With the increased associated parasitic capacitance, it takes more time to cause the potential change on the wire, which further increases DRAM latency.

Embodiments of the disclosure provide memory devices and methods for low latency memory access.

FIG. 2 illustrates a schematic diagram of an exemplary memory device 2000, according to some embodiments of the disclosure.

As shown in FIG. 2, memory device 2000 can include a plurality of memory blocks 200, a controller 202, a column selection line 204, a global data line 206, and, all of which function similar to their counterparts described with reference to FIGS. 1A-1B. Thus, description of the plurality of memory blocks 200, column selection line 204, global data line 206, and controller 202 are omitted herein for clarity. Memory device 2000 can further include a switch 212 disposed on a given position on column selection line 204 and a switch 214 disposed on another given position on global data line 206.

Switch 212 and switch 214 can be turned off to break column selection line 204 and global data line 206, respectively. For example, in response to a fast access signal generated by controller 202, switches 212 and 214 can be turned off.

By breaking column selection line 204 via switch 212, column selection line 204 is divided into an isolated selection line (indicated by the slim line in FIG. 2) and a connected selection line (indicated by the bold line in FIG. 2). As discussed with reference to FIG. 1B, a full wire of column selection line 204 can be connected to controller 202 before switch 212 is turned off. After switch 212 is turned off, part of column selection line 204 that is between controller 202 and switch 212 is still connected to controller 202, and thus is referred to as the connected selection line. The connected selection line can be connected with at least one memory block. As shown in FIG. 2, block 200a is connected with the connected selection line, and thus, still can be selected by controller 202 via the connected selection line. It is appreciated that, depending on a position of switch 212, more than one memory blocks can be selected by controller 202 via the connected selection line. On the other hand, after switch 212 is turned off, part of column selection line 204 (i.e., the slim part of column selection line 204) loses its connection with controller 202, and therefore is referred to as the isolated selection line. Thus, when switch 212 is turned off, only part of column selection line 104 is being connected to controller 202 and column selection line 204 is "shortened." Accordingly, the associated parasitic capacitance of column selection line 204 is also reduced, which causes less latency on column selection line 204.

Similarly, by breaking global data line 206 via switch 214, global data line 206 is divided into an isolated data line (indicated by the slim line in FIG. 2) and a connected data line (indicated by the bold line in FIG. 2). As discussed with reference to FIG. 1B, a full wire of global data line 206 is connected to data bus 208 before switch 204 is turned off After switch 214 is turned off, part of global data line 206 that is between data bus 208 and switch 214 is still connected to data bus 208, and thus is referred to as the connected data line. The connected data line can be connected with at least one memory block. As shown in FIG. 2, block 200a is connected with the connected data line, and thus, still can transceive data with data bus 208 via the connected data line. It is appreciated that, depending on a position of switch 214, more than one memory blocks can be connected to data bus 208 via the connected data line. On the other hand, after switch 214 is turned off, part of global data line 206 (i.e., the slim part of global data line 206) loses its connection with data bus 208, and therefore is referred to as the isolated data line. Thus, when switch 214 is turned off, only part of global data line 206 is being connected to data bus 208 and thus global data line 206 is "shortened." Accordingly, the associated parasitic capacitance of global data line 206 is also reduced, which causes less latency on global data line 206.

Switch 212, switch 214, and data bus 208 can segment at least one memory block (e.g., memory block 200a) of the plurality of memory blocks 200 from other memory blocks of the plurality of memory blocks 200. Switches 212 and 214 can enable the segmented at least one memory block to act as the fast access region relative to the other memory blocks. As shown in FIG. 2, the connected selection line and the connected data line can be used as two borders of fast access region 210, and switches 212 and 214 are two corners of fast access region 210. It is appreciated that, based on switches 212 and 214's positions in memory device 2000, more than one memory block can be included in fast access region 210.

FIG. 3 illustrates a schematic diagram of another exemplary memory device 3000, according to some embodiments of the disclosure.

In memory device 3000, compared with memory device 2000 of FIG. 2, a switch 314 on column selection line 204 is disposed on a position near memory block 200b. Therefore, a fast access region 310 segmented based on switch 214 and switch 314 can include memory blocks 200a and 200b. Controller 202 can receive an access request for accessing fast access region 210 or 310, and generate a fast access signal based on the access request. The fast access signal can turn off switches to enable fast access region 210 or 310. For example, in reading memory device 3000, controller 202 can receive a request for reading data stored in e.g., memory block 200b, and a fast access signal can be generated for turning off switch 214 and switch 314. Similarly, in writing memory device 3000, controller 202 can receive a request for writing data into e.g., memory block 200b, and another fast access signal can be generated for turning off switch 214 and switch 314. Methods for accessing a memory device according to some embodiments of the disclosure will be further described below.

Because the latency of column selection line 204 and data line 206 can be reduced by turning off switches, a speed for accessing to memory cells in fast access region 210 or 310 can be increased.

In some embodiments, in addition to switch 214 and switch 314, memory device 3000 can further include a switch 318 disposed on a given position on data bus 208. It is appreciated that the given position of switch 318 can correspond to the position of switch 314 on column selection line 204.

After switch 318 is turned off, part of data bus 208 that is between the I/O interface and switch 318 is still connected to data bus 208, while the other part of data bus 208 loses its connection with the I/O interface. Thus, when switch 318 is turned off, only part of data bus 208 is being connected to the I/O interface and thus data bus 208 is "shortened." Accordingly, the associated parasitic capacitance of data bus 208 is also reduced, which causes less latency on data bus 208. It is appreciated that switch 318 can also be turned off in response to the fast access signal.

By providing switch 318 on data bus 208, latency of data bus 208 can be reduced by turning off switch 318, a speed for accessing to memory cells in fast access region 310 can be further increased.

It is appreciated that, in addition to switch 314, switch 212 of FIG. 2 can be retained in some embodiments. Therefore, fast access region 310 itself can also be configurable. For example, when switch 212 is turned on and switches 214 and 314 are turned off, fast access region 310 can include blocks 200a and 200b. In another example, when switches 212 and 214 are turned off, fast access region 310 can only include block 200a regardless of whether switch 314 is turned on or off.

Figure 4:
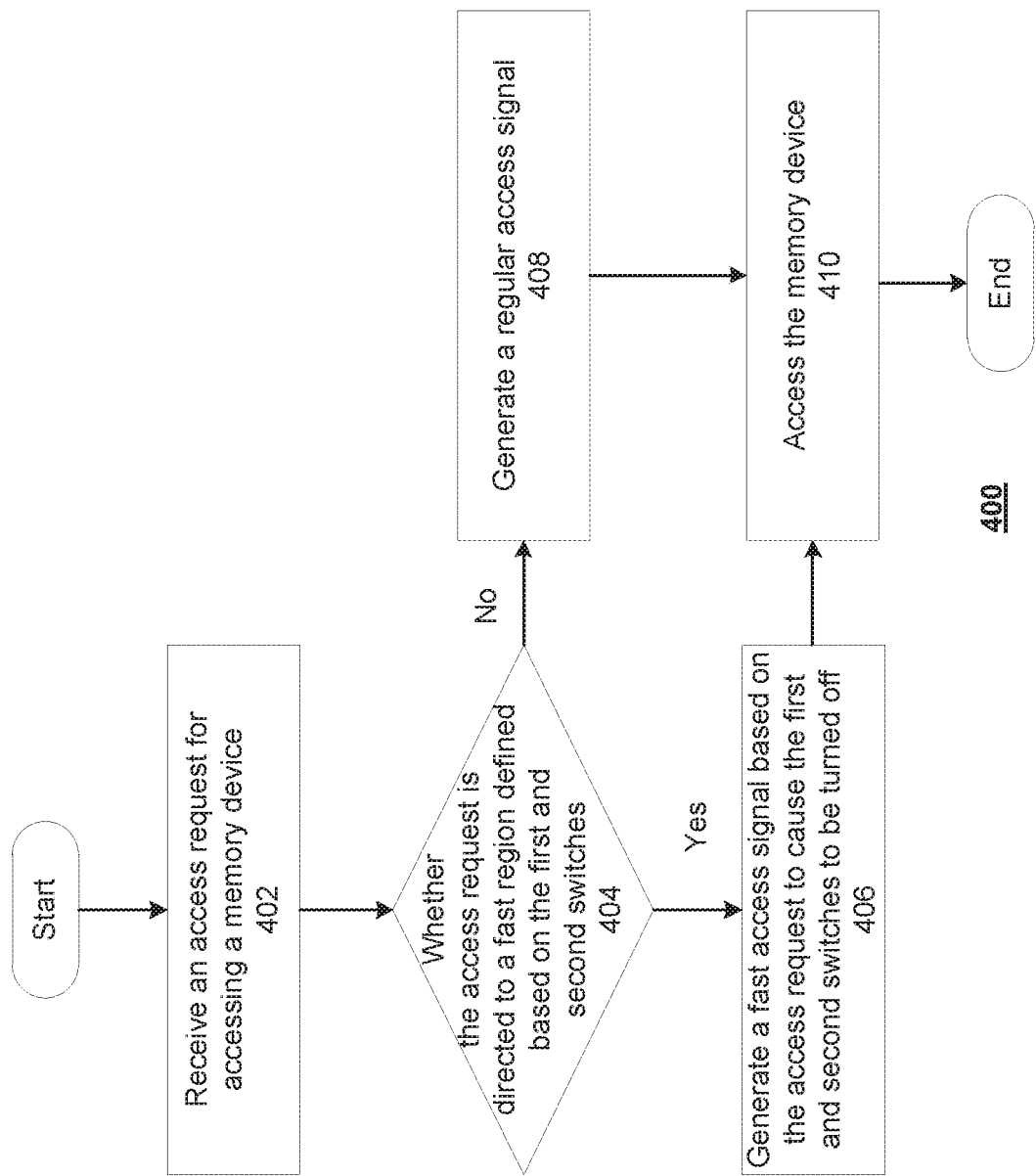
FIG. 4 is a flowchart of an exemplary method for accessing a memory device, according to some embodiments of the disclosure.

FIG. 4 is a flowchart of an exemplary method 400 for accessing a memory device, according to some embodiments of the disclosure. The memory device can include, for example, memory device 2000 or 3000 described above with reference to FIGS. 2-3. Therefore, the memory device can include a column selection line having a first switch disposed thereon and a global data line having a second switch disposed thereon. Method 400 can be implemented by the memory device (e.g., the controller of the memory device), and include steps as follows.

At step 402, the controller (e.g., controller 202) can receive an access request for accessing the memory device. The access request for accessing the memory device can include a request for reading data stored in the memory device or a request for writing data into the memory device.

At step 404, the controller can determine whether the access request is directed to a fast region defined based on the first and second switches. In some embodiments, the controller can parse the access request and determine an access address associated with the access request. For example, when the access request is a reading request, the controller can parse the reading requst and determine an address of a memory block to be read. Then, the controller can determine whether the access address is within the fast region. As discussed above, the first and second switches on the column selection line and the global data line can define the fast region including at least one memory block, and thus, the fast region can also provide addresses of the at least one memory block. For example, the addresses of the at least one memory block in the fast region can be stored in a table. Accordingly, the controller can determine whether the access address is within the fast region by comparing the access address with the table. In response to the access address being within the fast region, the controller can determine the access request is directed to the fast region.

In some embodiments, the access request can further include an indication field. The indication field can be used to indicate whether the access request is directed to the fast region. For example, when the indication field is assigned with "1," it can indicate that the access request is directed to the fast region. Thus, the controller can determine whether the indication field satisfies a given condition (e.g., the indication field being "1"), and in response to the indication field satisfying the given condition, the controller can determine the access request is directed to the fast region.

At step 406, in response to the access request being directed to the fast region, the controller can generate a fast access signal based on the access request to cause the first and second switches to be turned off In some embodiments, the first and second switches can be field effect transistors (FETs), and the fast access signal can include an "off" signal applied to turn off the FETs. It is appreciated that, in addition to the "off" signal, the fast access signal can also include other instructions to cause the memory device to perform the requested actions (e.g., reading/writing data). Then, method 400 can jump to step 410.

At step 408, in response to the access request being not directed to the fast region, the controller can generate a regular access signal. The regular access signal can include conventional instructions for memory access. In some embodiments, difference between the fast access signal and the regular access signal is the "off" signal described above. Thus, under the regular access signal, the first and second switches can stay being turned on.

At step 410, the controller can perform the access to the memory device based on the fast access signal or the regular access signal.

In some embodiments, the memory device can also include a data bus having a third switch disposed thereon. Similarly, the fast access signal can also cause the third switch to be turned off.

Figure 5:
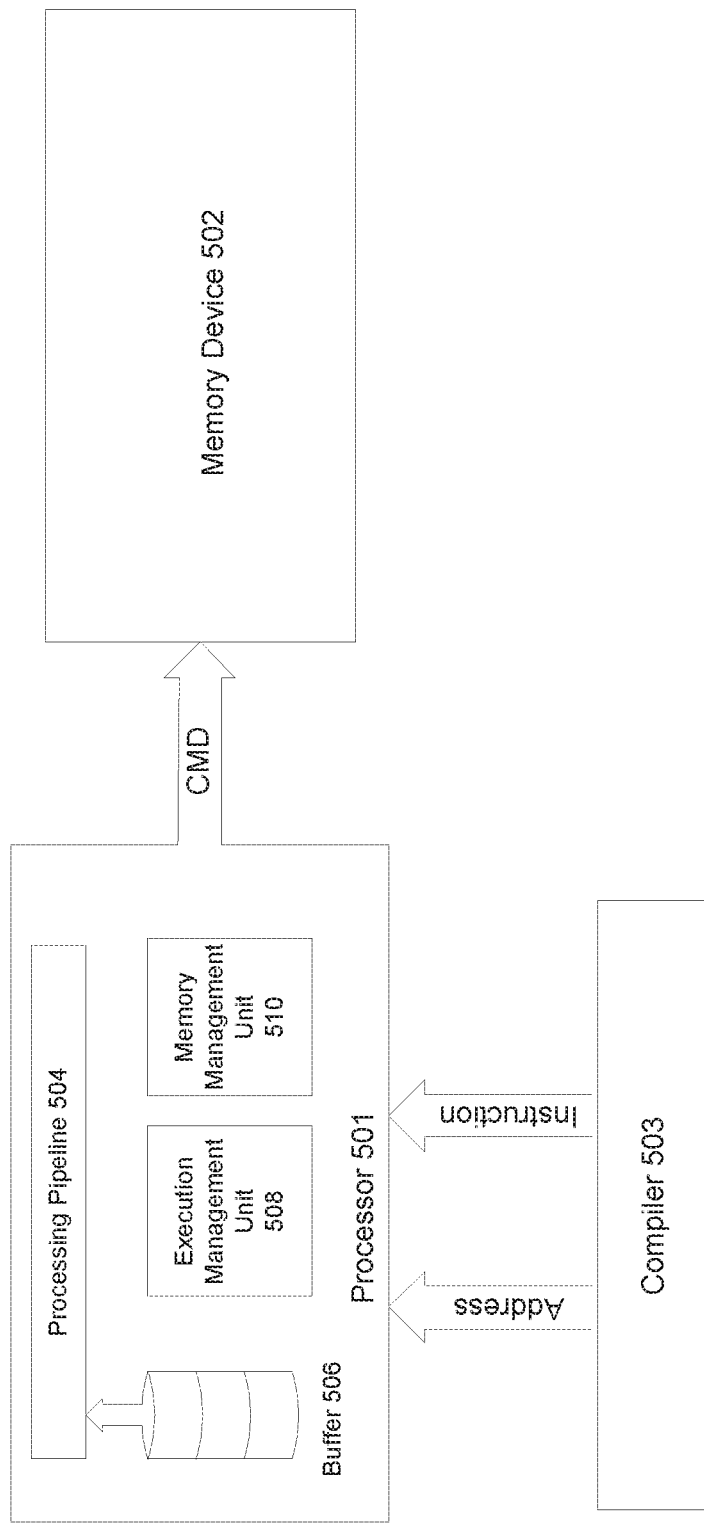
FIG. 5 illustrates an exemplary memory system, according to some embodiments of the disclosure.

FIG. 5 illustrates an exemplary memory system 500, according to some embodiments of the disclosure. Memory system 500 can include the above-described memory devices and perform the above-described methods. As shown in FIG. 5, memory system 500 can include a processor 501 and a memory device 502.

Processor 501 can be a computing processor for generating memory commands for the execution of memory device 502. In some embodiments, processor 501 can include a command scheduler for scheduling the memory commands under instructions received from a compiler.

Memory device 502 can be a DRAM device and can store data and instructions. The instructions can be a part of a computing program that accesses data stored in memory device 502. Memory device 502 can include a plurality of memory blocks, each having a plurality of rows for storing data. Each row of a memory block can store one or more data elements, depending on a size of a data element.

Memory system 500 can further include a compiler 503. Compiler 503 can run on a processing unit. The processing unit can be an external processing unit (e.g., a host CPU) or a component of memory system 500. Compiler 503 can compile a computing program (e.g., a machine learning program) into a set of instructions, such as a "read" instruction, a "write" instruction, a "copy" instruction, an "allocate" instruction, and the like. It is appreciated that the "copy" instruction can include a "read" instruction and a "write" instruction, both of which can be associated with a request for allocating memory space in memory device 502. And the "allocate" instruction itself can be the request for allocating memory space in memory device 502.

The generated instructions (e.g., the "write" instruction, the "copy" instruction, the "allocate" instruction) can be then processed by processor 501. Processor 501 can include a processing pipeline 504, an instruction buffer 506, an execution management unit 508, and a memory management unit (MMU) 510. Each of the units and buffers may include a set of combinational and sequential logic circuits constructed based on, for example, metal oxide semiconductor field effect transistors (MOSFET). Execution management unit 508 can control and manage the execution of instructions by processing pipeline 504. For example, after execution management unit 508 receives an indication (e.g., from an operating system) to execute the computing program including e.g., a request for allocating memory space, execution management unit 508 can create a computing process, which can provide an indication of the state of execution of the computing program by processing pipeline 504. After creating the computing process, execution management unit 508 can load the computing program from a secondary storage device (e.g., a hard disk drive) into memory device 502, and control instruction buffer 506 to acquire a set of instructions associated with the computing program from memory device 502.

The set of instructions can be stored and executed according to a sequential order reflected in the computing program. For example, as shown in FIG. 5, instruction buffer 506 includes a buffer head pointer and a buffer tail pointer. Under the control of execution management unit 508, instruction buffer 506 may fetch an instruction stored at a buffer location associated with the buffer head pointer to processing pipeline 504 for execution. Processing pipeline 504, when executing the instruction, can access memory device 502 to transmit or receive data according to the instruction. After fetching the instruction, instruction buffer 506 can remove the instruction from the buffer and move buffer head pointer to the next buffer location to fetch the next instruction for execution.

Execution management unit 508 can control the fetching of instructions by instruction buffer 506 based on various criteria. For example, execution management unit 508 may determine whether an instruction causes an exception. An exception may occur when the execution of the instruction can lead to anomalous or exceptional operating conditions for the computer processor. As an illustrative example, the "allocate" instruction of the computing program may cause processor 501 to access a memory location within memory device 502 that does not exist, or a memory location that processor 501 has no access permission.

MMU 510 allocates and manages memory spaces for different computing processes. After execution management unit 508 creates a computing process for the execution of the computing program, MMU 510 can assign a set of device memory locations in memory device 502, with each memory location being associated with a device address. MMU 510 can also create a virtual memory space and provide the virtual memory space to the computing process as an alias to the set of physical memory locations. The virtual memory space can include a set of pages, each of which can include a set of contagious virtual memory locations. Each virtual memory location can be associated with a virtual memory address and can be mapped to a device memory location assigned by MMU 510. A page typically includes 4096 bytes of memory space.

In some embodiments, processor 501 can determine if a memory command is directed to a fast access region. If the memory command is directed to the fast access region, processor 501 can further generate signals for turning off switches associated with the fast access region.

In some embodiments, a computer program product may include a non-transitory computer-readable storage medium having computer-readable program instructions thereon for causing one or more processors to carry out the above-described methods. For example, one or more processors of a computing system can execute the computer-readable program instructions to compile instructions for causing the above-described memory devices to implement the above-described methods.

The computer-readable storage medium may be a tangible device that can store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

The computer-readable program instructions for carrying out the above-described methods may be assembler instructions, instruction-set-architecture (ISA) instructions, machine instructions, machine dependent instructions, microcode, firmware instructions, state-setting data, or source code or object code written in any combination of one or more programming languages, including an object-oriented programming language, and conventional procedural programming languages. The computer readable program instructions may execute entirely on a computing device as a stand-alone software package, or partly on a first computing device and partly on a second computing device remote from the first computing device. In the latter scenario, the second, remote computing device may be connected to the first computing device through any type of network, including a local area network (LAN) or a wide area network (WAN).

The computer-readable program instructions may be provided to one or more processors of a computer, or other programmable data processing apparatus to produce a machine, such that the instructions, which execute via the one or more processors of the computer or other programmable data processing apparatus, create means for implementing the above-described methods.

When implemented, the embodiments can provide significant improvements over the conventional design. For example, when comparing the conventional design having a memory structure using memory blocks with a similar memory structure utilizing the embodiments of this disclosure, the delays in the column selection line and on the data bus were approximately twice as slow in the conventional system and the delay in the global data line was approximately four times as slow in the conventional system. Therefore, the latency of the memory device according to embodiments of the disclosure can be decreased significantly. It is appreciated that decreased latency can be related to a size of the fast access region, and the result can vary depending on parameters of the memory device.

Though above embodiments implement devices and methods for low latency memory access with a pair of switches on the global data line and the column selection line, more pairs of switches may be disposed to provide flexibility for defining multiple fast access regions.

The flow charts and diagrams in the figures illustrate the architecture, functionality, and operation of possible implementations of devices, methods, and computer program products according to various embodiments of the specification. In this regard, a block in the flow charts or diagrams may represent a software program, segment, or portion of code, which comprises one or more executable instructions for implementing specific functions. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the diagrams or flow charts, and combinations of blocks in the diagrams and flow charts, may be implemented by special purpose hardware-based systems that perform the specified functions or acts, or combinations of special purpose hardware and computer instructions.

The embodiments may further be described using the following clauses:

1. A memory device, comprising:
a plurality of memory blocks, each comprising a plurality of memory cells;
a word line communicatively coupled with the plurality of memory blocks and configured to activate memory cells associated with the word line in the plurality of memory blocks;
a column selection line communicatively coupled with the plurality of memory blocks and configured to select a column of memory blocks among the plurality of memory blocks;
a global data line communicatively coupled with the plurality of memory blocks and configured to transceive data with the activated memory cells in the selected column of memory blocks;
a first switch disposed on a first position on the column selection line; and
a second switch disposed on a second position on the global data line, wherein the first switch and the second switch are configured to segment at least one memory block of the plurality of memory blocks from other memory blocks of the plurality of memory blocks.

2. The memory device according to clause 1, wherein the first and second switches enable the segmented at least one memory block to act as a fast access region relative to the other memory blocks.

3. The memory device according to clause 1 or 2, further comprising a data bus connected to the global data line and configured to transceive data with the global data line, wherein the data bus further comprises a third switch provided on a third position corresponding to the second position.

4. The memory device according to clause 3, further comprising a controller communicatively coupled with the column selection line and the global data line.

5. The memory device according to clause 4, wherein the controller is further configured to:
receive an access request for accessing the fast access region; and
generate a fast access signal based on the access request.

6. The memory device according to clause 5, wherein in segmenting the at least one memory block of the plurality of memory blocks from other memory blocks of the plurality of memory blocks,
the first switch is configured to cut off the column selection line to form a connected column selection line and a disconnected column selection line, in response to the fast access signal; and
the second switch is configured to cut off the global data line to form a connected global data line and a disconnected global data line, in response to the fast access signal.

7. The memory device according to clause 6, wherein in response to the fast access signal, the third switch is configured to cut off the data bus to form a connected data bus and a disconnected data bus.

8. The memory device according to clause 7, wherein parasitic capacitance associated with the connected column selection line, the connected global data line, and the connected data bus is less than that of the column selection line, the global data line, and the data bus, causing reduced latency on the connected column selection line, the connected global data line, and the connected data bus, and wherein the connected column selection line, the connected global data line, and the connected data bus form the fast access region.

9. The memory device according to clause 5, wherein the access request comprises a request for reading data stored in the memory device or a request for writing data into the memory device.

10. The memory device according to any one of clauses 1-9, wherein the first and second switches are field effect transistors.

11. A method for accessing a memory device, wherein the memory device comprises a column selection line having a first switch disposed thereon and a global data line having a second switch disposed thereon, the method comprising:
receiving an access request for accessing the memory device having a plurality of memory blocks;
determining whether the access request is directed to a region having at least one memory block of the plurality of memory blocks;
in response to the access request being directed to the region, generating a first-type access signal based on the access request to cause the first and second switches to be turned off to segment the at least one memory block from other memory blocks of the plurality of memory blocks; and
accessing the segmented at least one memory block based on the first-type access signal.

12. The method according to clause 11, further comprising:
in response to the access request being not directed to the fast region, generating a second-type access signal; and
accessing the plurality of memory blocks based on the second-type access signal.

13. The method according to clause 11 or 12, wherein determining whether the access request is directed to the region further comprises:
determining an access address associated with the access request;
determining whether the access address is within the region;
in response to the access address being within the region, determining that the access request is directed to the region.

14. The method according to clause 11 or 12, wherein the access request further comprises an indication field, and determining whether the access request is directed to the region further comprises:
determining whether the indication field satisfies a given condition;
in response to the indication field satisfying the given condition, determining that the access request is directed to the region.

15. The method according to any one of clauses 11-14, wherein the memory device further comprises a data bus having a third switch disposed thereon, and the first-type access signal further causes the third switch to be turned off.

16. The method according to any one of clauses 11-15, wherein the access request for accessing the memory device comprises a request for reading data stored in the memory device or a request for writing data into the memory device.

17. A non-transitory computer readable medium that stores a set of instructions that is executable by one or more processors of a computer system to cause the computer system to perform a method for accessing a memory device of the computer system, wherein the memory device comprises a column selection line having a first switch disposed thereon and a global data line having a second switch disposed thereon, the method comprising:
receiving an access request for accessing the memory device having a plurality of memory blocks;

determining whether the access request is directed to a region having at least one memory block of the plurality of memory blocks;

in response to the access request being directed to the region, generating a first-type access signal based on the access request to cause the first and second switches to be turned off to segment the at least one memory block from other memory blocks of the plurality of memory blocks; and accessing the segmented at least one memory block based on the first-type access signal.

18. The non-transitory computer readable medium according to clause 17, wherein the one or more processors are configured to execute the set of instructions to further cause the computer system to perform:

in response to the access request being not directed to the fast region, generating a second-type access signal; and accessing the plurality of memory blocks based on the second-type access signal.

19. The non-transitory computer readable medium according to clause 17 or 18, wherein in determining whether the access request is directed to the region, the one or more processors are configured to execute the set of instructions to further cause the computer system to perform:

determining an access address associated with the access request;

determining whether the access address is within the region;

in response to the access address being within the region, determining that the access request is directed to the region.

20. The non-transitory computer readable medium according to clause 17 or 18, wherein the access request further comprises an indication field, and in determining whether the access request is directed to the region, the one or more processors are configured to execute the set of instructions to further cause the computer system to perform:

determining whether the indication field satisfies a given condition;

in response to the indication field satisfying the given condition, determining that the access request is directed to the region.

21. The non-transitory computer readable medium according to any one of clauses 17-20, wherein the memory device further comprises a data bus having a third switch disposed thereon, and the first-type access signal further causes the third switch to be turned off.

22. The non-transitory computer readable medium according to any one of clauses 17-21, wherein the access request for accessing the memory device comprises a request for reading data stored in the memory device or a request for writing data into the memory device.

It is appreciated that certain features of the specification, which are, for clarity, described in the context of separate embodiments, may also be provided in combination in a single embodiment. Conversely, various features of the specification, which are, for brevity, described in the context of a single embodiment, may also be provided separately or in any suitable subcombination or as suitable in any other described embodiment of the specification. Certain features described in the context of various embodiments are not to be considered essential features of those embodiments, unless the embodiment is inoperative without those elements.

What is claimed is:

1. A memory device, comprising:
   a plurality of memory blocks, each comprising a plurality of memory cells;
   a word line communicatively coupled with the plurality of memory blocks and configured to activate memory cells associated with the word line in the plurality of memory blocks;
   a column selection line communicatively coupled with the plurality of memory blocks and configured to select a column of memory blocks among the plurality of memory blocks;
   a global data line communicatively coupled with the plurality of memory blocks and configured to transceive data with the activated memory cells in the selected column of memory blocks;
   a first switch disposed on a first position on the column selection line; and
   a second switch disposed on a second position on the global data line, wherein the first switch and the second switch are configured to segment at least one memory block of the plurality of memory blocks from other memory blocks of the plurality of memory blocks, the segmented at least one memory block being defined by a portion of the column selection line and a portion of the global data line,
   wherein the first and second switches enable the segmented at least one memory block to act as a fast access region relative to the other memory blocks.

2. The memory device according to claim 1, further comprising a data bus connected to the global data line and configured to transceive data with the global data line, wherein
   the data bus further comprises a third switch provided on a third position corresponding to the second position.

3. The memory device according to claim 2, further comprising a controller communicatively coupled with the column selection line and the global data line.

4. The memory device according to claim 3, wherein the controller is further configured to:
   receive an access request for accessing the fast access region; and
   generate a fast access signal based on the access request.

5. The memory device according to claim 4, wherein in segmenting the at least one memory block of the plurality of memory blocks from other memory blocks of the plurality of memory blocks,
   the first switch is configured to cut off the column selection line to form a connected column selection line and a disconnected column selection line, in response to the fast access signal; and
   the second switch is configured to cut off the global data line to form a connected global data line and a disconnected global data line, in response to the fast access signal.

6. The memory device according to claim 5, wherein in response to the fast access signal, the third switch is configured to cut off the data bus to form a connected data bus and a disconnected data bus.

7. The memory device according to claim 6, wherein parasitic capacitance associated with the connected column selection line, the connected global data line, and the connected data bus is less than that of the column selection line, the global data line, and the data bus, causing reduced latency on the connected column selection line, the connected global data line, and the connected data bus, and wherein the connected column selection line, the connected global data line, and the connected data bus form the fast access region.

8. The memory device according to claim 4, wherein the access request comprises a request for reading data stored in the memory device or a request for writing data into the memory device.

9. The memory device according to claim 1, wherein the first and second switches are field effect transistors.

10. A method for accessing a memory device, wherein the memory device comprises a column selection line having a first switch disposed thereon and a global data line having a second switch disposed thereon, the method comprising:
   receiving an access request for accessing the memory device having a plurality of memory blocks;
   determining whether the access request is directed to a region having at least one memory block of the plurality of memory blocks, the region being defined by a portion of the column selection line and a portion of the global data line and segmented by the first switch and the second switch, and wherein the first and second switches enable the segmented at least one memory block to act as a fast access region relative to the other memory blocks;
   in response to the access request being directed to the region, generating a first-type access signal based on the access request to cause the first and second switches to be turned off to segment the at least one memory block from other memory blocks of the plurality of memory blocks; and
   accessing the segmented at least one memory block based on the first-type access signal.

11. The method according to claim 10, further comprising:
   in response to the access request being not directed to the region, generating a second-type access signal; and
   accessing the plurality of memory blocks based on the second-type access signal.

12. The method according to claim 10, wherein determining whether the access request is directed to the region further comprises:
   determining an access address associated with the access request;
   determining whether the access address is within the region;
   in response to the access address being within the region, determining that the access request is directed to the region.

13. The method according to claim 10, wherein the access request further comprises an indication field, and determining whether the access request is directed to the region further comprises:
   determining whether the indication field satisfies a given condition;
   in response to the indication field satisfying the given condition, determining that the access request is directed to the region.

14. The method according to claim 10, wherein the memory device further comprises a data bus having a third switch disposed thereon, and the first-type access signal further causes the third switch to be turned off.

15. The method according to claim 10, wherein the access request for accessing the memory device comprises a request for reading data stored in the memory device or a request for writing data into the memory device.

16. A non-transitory computer readable medium that stores a set of instructions that is executable by one or more processors of a computer system to cause the computer system to perform a method for accessing a memory device of the computer system, wherein the memory device comprises a column selection line having a first switch disposed thereon and a global data line having a second switch disposed thereon, the method comprising:
   receiving an access request for accessing the memory device having a plurality of memory blocks;
   determining whether the access request is directed to a region having at least one memory block of the plurality of memory blocks, the region being defined by a portion of the column selection line and a portion of the global data line and segmented by the first switch and the second switch, and wherein the first and second switches enable the segmented at least one memory block to act as a fast access region relative to the other memory blocks;
   in response to the access request being directed to the region, generating a first-type access signal based on the access request to cause the first and second switches to be turned off to segment the at least one memory block from other memory blocks of the plurality of memory blocks; and
   accessing the segmented at least one memory block based on the first-type access signal.

17. The non-transitory computer readable medium according to claim 16, wherein the one or more processors are configured to execute the set of instructions to further cause the computer system to perform:
   in response to the access request being not directed to the region, generating a second-type access signal; and
   accessing the plurality of memory blocks based on the second-type access signal.

18. The non-transitory computer readable medium according to claim 16, wherein in determining whether the access request is directed to the region, the one or more processors are configured to execute the set of instructions to further cause the computer system to perform:
   determining an access address associated with the access request;
   determining whether the access address is within the region;
   in response to the access address being within the region, determining that the access request is directed to the region.

19. The non-transitory computer readable medium according to claim 16, wherein the access request further comprises an indication field, and in determining whether the access request is directed to the region, the one or more processors are configured to execute the set of instructions to further cause the computer system to perform:
   determining whether the indication field satisfies a given condition;
   in response to the indication field satisfying the given condition, determining that the access request is directed to the region.

20. The non-transitory computer readable medium according to claim 16, wherein the memory device further comprises a data bus having a third switch disposed thereon, and the first-type access signal further causes the third switch to be turned off.

21. The non-transitory computer readable medium according to claim 16, wherein the access request for accessing the memory device comprises a request for reading data stored in the memory device or a request for writing data into the memory device.

* * * * *